United States Patent
Chiu

(10) Patent No.: US 7,314,809 B2
(45) Date of Patent: Jan. 1, 2008

(54) METHOD FOR FORMING A SHALLOW TRENCH ISOLATION STRUCTURE WITH REDUCED STRESS

(75) Inventor: Wen-Pin Chiu, Yun Lin Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 257 days.

(21) Appl. No.: 11/076,908

(22) Filed: Mar. 11, 2005

(65) Prior Publication Data

US 2006/0128115 A1 Jun. 15, 2006

(30) Foreign Application Priority Data

Dec. 9, 2004 (TW) .............................. 93138139 A

(51) Int. Cl.
*H01L 21/76* (2006.01)

(52) U.S. Cl. ................ 438/437; 257/E21.549

(58) Field of Classification Search ................ 438/437, 438/424; 257/E21.549, E21.438
See application file for complete search history.

(56) References Cited

U.S. PATENT DOCUMENTS

| 6,468,853 | B1 | 10/2002 | Balasubramanian et al. | |
| 2003/0040189 | A1* | 2/2003 | Chang et al. | 438/700 |
| 2003/0207591 | A1* | 11/2003 | Lu et al. | 438/770 |
| 2004/0240822 | A1* | 12/2004 | Patel et al. | 385/130 |
| 2005/0020043 | A1* | 1/2005 | Lai | 438/587 |
| 2005/0186755 | A1* | 8/2005 | Smythe et al. | 438/424 |

* cited by examiner

*Primary Examiner*—Bradley K Smith
(74) *Attorney, Agent, or Firm*—Rosenberg, Klein & Lee

(57) ABSTRACT

A method for forming a shallow trench isolation (STI) structure with reduced stress is described. An amorphous silicon layer is deposited on a trench surface of a shallow trench isolation structure, and the amorphous silicon is then oxidized by thermal oxidation to form a liner oxide. The thickness of the liner oxide is uniform to reduce stress caused by a liner oxide having non-uniform thickness in the prior art, and the leakage risk between the semiconductor devices can thus be prevented.

12 Claims, 4 Drawing Sheets

METHOD FOR FORMING A SHALLOW TRENCH ISOLATION STRUCTURE WITH REDUCED STRESS

RELATED APPLICATIONS

The present application is based on, and claims priority from, Taiwan Application Serial Number 93138139, filed Dec. 9, 2004, the disclosure of which is hereby incorporated by reference herein in its entirety.

BACKGROUND

1. Field of Invention

The present invention relates to a method for forming a shallow trench isolation (STI) structure in the semiconductor device process. More particularly, the present invention relates to a method for forming an STI structure with reduced stress.

2. Description of Related Art

In the field of the semiconductor technologies, many semiconductor devices are often integrated and manufactured on identical semiconductor wafer. Therefore, an appropriate isolation structure is necessary between all semiconductor devices on the semiconductor wafer for preventing an undesired electronic leakage or short, which results in a bad semiconductor.

One of the conventional methods for forming the isolation structure is Local Oxidation of Silicon (LOCOS). The fundamental of LOCOS is utilizing a mask to cover a semiconductor device at first, in which only some silicon substrate regions of the semiconductor device where the isolation structures are to be formed in are exposed, and then a thermal oxide ($SiO_2$) layer is grown on the exposed silicon substrate regions by thermal oxidation. The grown $SiO_2$ layers can directly be the isolation structures between the semiconductor devices due to the perfect electrical isolation capability of $SiO_2$.

Both the process and equipment used to form an isolation structure by LOCOS are uncomplicated, but the disadvantages of LOCOS are greater and more apparent in the advanced semiconductor process. For an example, a longer heating time is needed by LOCOS and it involves a higher thermal budgets. Additionally, in the advanced semiconductor process, the feature size of a semiconductor and the distances between devices are smaller and smaller, and the size of a $SiO_2$ isolation structure is also harder and harder to control. Thus, the $SiO_2$ isolation structure will easily extend into the active region of the semiconductor device and cause faults in the semiconductor device.

Therefore, the shallow trench isolation (STI) technique is often utilized to form an isolation structure at present. The fundamental of STI technique is forming the trenches by etching a silicon substrate, and the $SiO_2$ is directly deposited into the trenches in place of the step of forming the $SiO_2$ layer by thermal oxidizing the silicon substrate. Because the size of the trench is very similar to the size of the isolation structure, the size of isolation structure will almost never exceed an expected size, and the problem of the thermal budget with excessive heat is also solved because the heating step is omitted.

FIG. 1 shows a trench structure in an STI structure without the $SiO_2$ layer. It can be seen that a silicon substrate 102 is covered by a pad oxide 104 formed by $SiO_2$, and the pad oxide 104 is covered by a mask layer 106 formed by silicon nitride ($Si_3N_4$). The mask layer 106 is used as an etching mask for forming a trench 108 on the silicon substrate 102. Then, a $SiO_2$ layer is grown on the surface of the trench 108 by oxidation in a typical STI process with a high temperature, that is, a liner oxide 110.

In general, the material of a semiconductor wafer substrate is the silicon with single crystal orientation, such as the silicon substrate 102 shown in FIG. 1. Therefore, the oxidation rate is limited by the crystal orientation; that is to say, portions of the silicon substrate with different orientations have different oxidation rates during the thermal oxidation process. According to the foregoing description, when the trench structure shown in FIG. 1 is thermally oxidized, each of the surfaces of the trench 108, such as the lateral and the bottom surfaces, will have different oxidation rates; thus, the $SiO_2$ layer grows with different thicknesses on each corner 112. Therefore, high stress is readily generated in the corner 112, and then a leakage risk appears in the semiconductor devices cause by the high stress in the corner 102 of the trench structure.

According to the foregoing description, when a STI process within a semiconductor process is performed, a method for reducing or eliminating the stress is really needed to reduce or prevent the leakage risk between the semiconductor devices.

SUMMARY

It is therefore an objective of the present invention to provide a method for forming a STI structure within a semiconductor device process.

It is another objective of the present invention to provide a method for reducing or eliminating the stress in an STI structure within a semiconductor device process.

It is still another objective of the present invention to provide a method for reducing or preventing the leakage risk between the devices within a semiconductor device process.

According to the foregoing objectives of the invention, a pad oxide is formed on a silicon substrate, a mask layer is formed on the pad oxide and a photoresist is formed on the mask layer, first. Then, the photoresist is utilized in the mask layer etching process and then the photoresist is removed. Next, the patterned mask layer is utilized in the pad oxide and silicon substrate etching process for forming a trench on the silicon substrate. After the trench is formed, an amorphous silicon layer is deposited on the surface of whole structure. Then, the amorphous silicon layer is oxidized to a $SiO_2$ layer by a high temperature, and becomes a liner oxide. After the liner oxide is formed, the trench is filled with $SiO_2$ as a fill layer. Next, portions of the $SiO_2$ over the mask are removed by polishing. Finally, portions of whole structure over the surface of the silicon substrate are removed by etching to complete a STI structure.

The purposes of the STI structure completed by the foregoing steps are identical to those of the conventional STI structure, but the former provides better isolation. Because the liner oxide adhering at the surface of the trench is formed from the oxidized amorphous silicon material, the thickness of the whole liner oxide is uniform, stress does not appear in the corners of the liner oxide, and the leakage risk can be further prevented.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
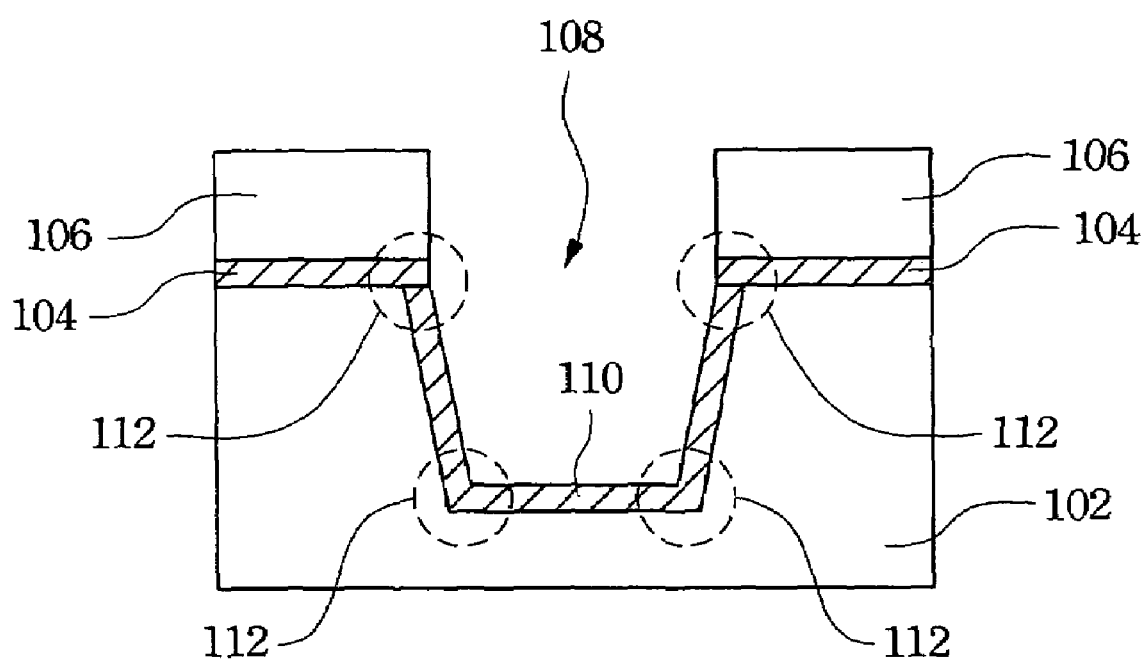
FIG. 1 is a lateral, cross-sectional view of a conventional STI structure.

Reference will now be made in detail to the present preferred embodiments of the invention, examples of which are illustrated in the accompanying drawings. Wherever possible, the same reference numbers are used in the drawings and the description to refer to the same or like parts.

A $SiO_2$ layer formed by thermal oxidation a single crystal of silicon in a trench structure results in different oxidation rates at the corners because the orientations of the crystal at the corners are different. This results in uneven thickness of the $SiO_2$ layer. Therefore, a general idea of the present invention is to deposit an amorphous silicon layer on the surface of the trench structure before the step of thermal oxidation the silicon substrate of the trench structure. The amorphous silicon naturally lacks the problem resulting from the different orientations of crystal because the amorphous silicon is not crystalline. Consequently, a $SiO_2$ layer with a uniform thickness can be grown by an uniform oxidation rate from the amorphous silicon layer in the trench structure, and the stress at the trench structure can be further prevented.

Figure 2A:
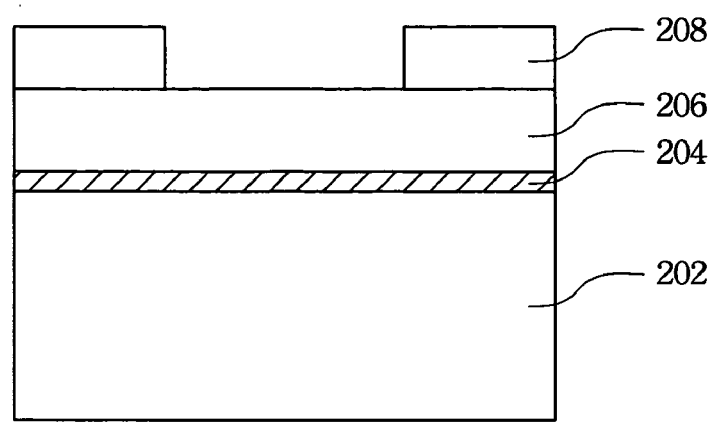
FIG. 2A-2H are lateral, cross-sectional views of an STI structure accompanied by each steps of the method according to a preferred embodiment of the present invention.

FIGS. 2A-2H separately show each step of the process according to a preferred embodiment of the present invention. In FIG. 2A, a process such as thermal oxidation is used to form a pad oxide 204 formed by $SiO_2$ on a silicon substrate 202. Then, a deposition process such as Low Pressure Chemical Vapor Deposition (LPCVD) is utilized to deposit a material such as $Si_3N_4$ on the pad oxide 204 as a mask layer 206. Finally, a photoresist is coated on the mask layer 206, and the regions predetermined to form the trenches are exposed.

Figure 2B:
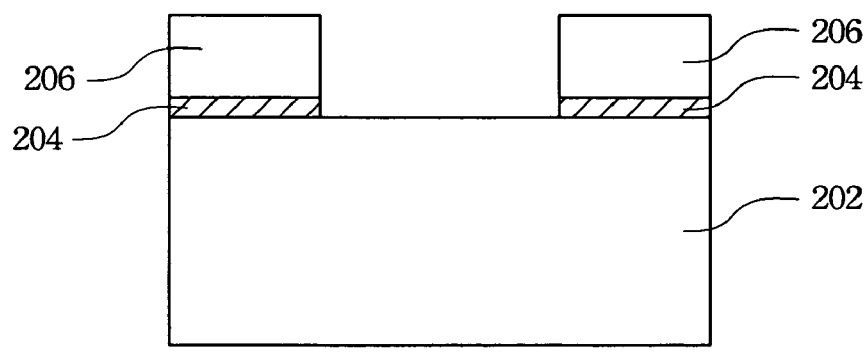

In FIG. 2B, the portions of the pad oxide 204 and mask layer 206 not protected by the photoresist 208 are removed from the surface of silicon substrate 202 by a process such as general photolithography to form a mask used to etch the silicon substrate 202. Then, the photoresist 202 is removed.

Figure 2C:
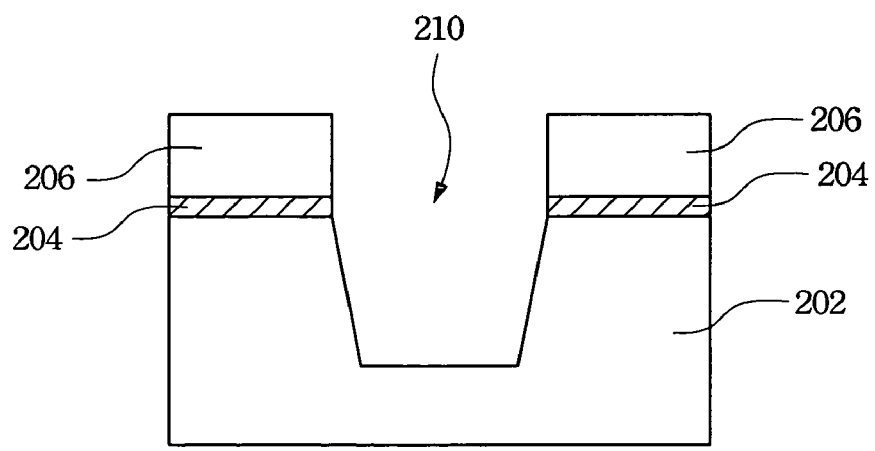

In FIG. 2C, a trench 210 is formed by an anisotropic etching process such as reactive ion etching to etch silicon substrate 202 via the mask comprising the pad oxide 204 and mask layer 206. In general, the side walls of the trench, that is, the trench 210, formed by this kind of process are approximately perpendicular. Thus, corner structures exist between the side walls and the bottom of the trench 210.

Figure 2D:
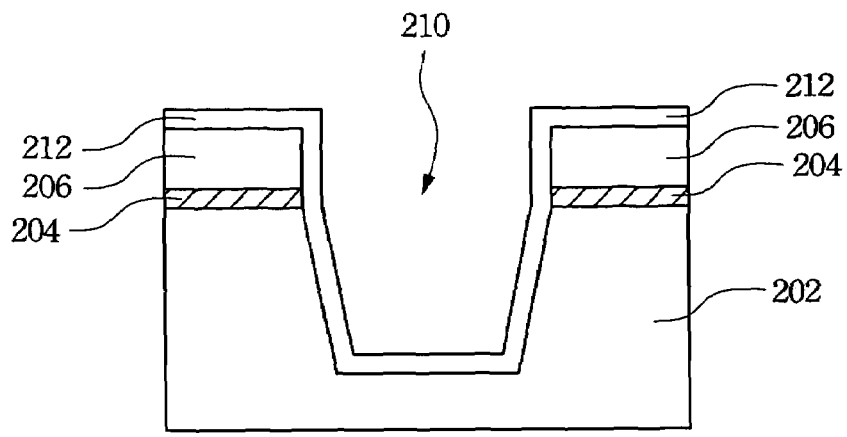

In, FIG. 2D, a conformal amorphous silicon layer 212 is deposited on the whole structure by a deposition process such as Low Pressure Chemical Vapor Deposition (LPCVD). That is to say, the portion of the amorphous silicon layer 212 deposited into the trench 210 has side walls and corners structure identical to those of the trench 210. In this embodiment, the thickness of the amorphous silicon layer 212 is between about 1 nm and 30 nm.

Figure 2E:
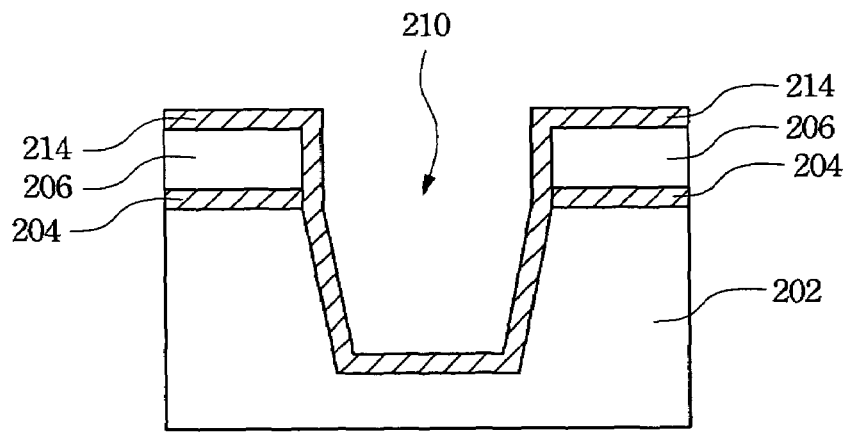

In FIG. 2E, a liner oxide 214 is formed from the amorphous silicon layer 212 by a process such as furnace oxidation or Rapid Thermal Process (RTP) at a high temperature. The oxidation rate of the whole amorphous silicon layer 212 is very uniform in the duration of the thermal oxidation because the amorphous silicon material is not crystalline and therefore does not have the orientation problem as single crystal. Consequently, the thickness of the whole liner oxide 214 is uniform, even at the side walls and the corners of the trenches.

Figure 2F:
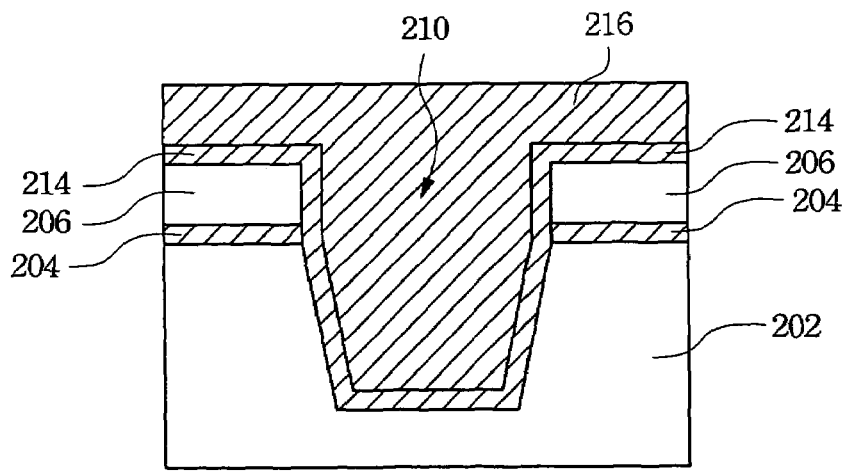

In FIG. 2F, a fill layer is formed on the whole structure by utilizing a deposition process such as LPCVD to fill the trench 210. The material used to fill the trench 210 may be $SiO_2$ produced by a Chemical Vapor Deposition (CVD) process wherein the deposition vapor source is Tetraethylorthosilicate (TEOS).

Figure 2G:
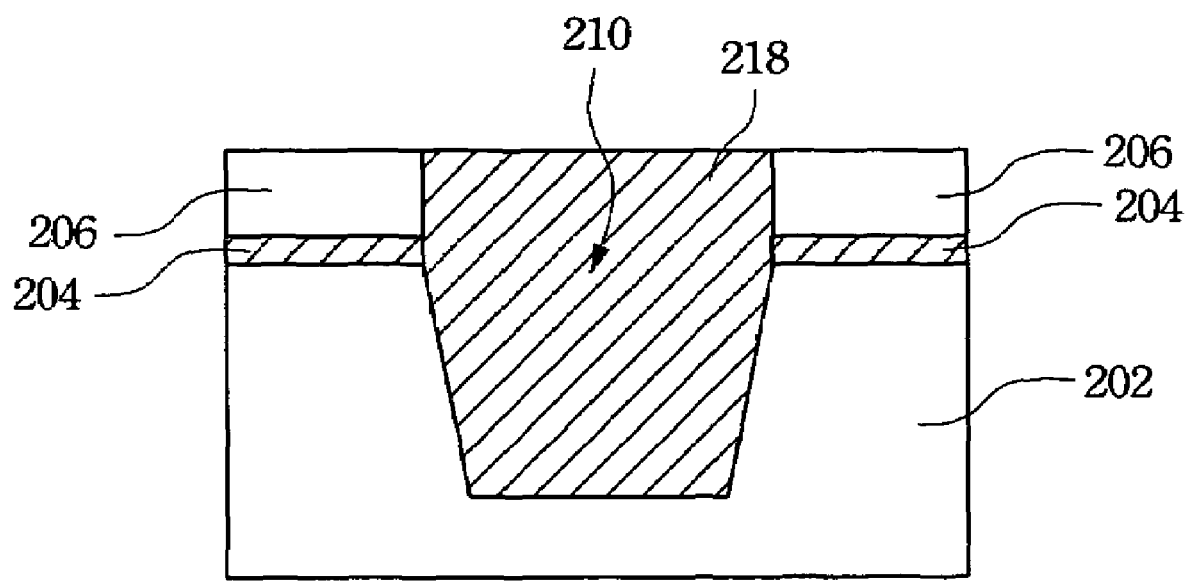

In FIG. 2G, the portion of the $SiO_2$ over the mask layer 206 is removed by a process such as Chemical Mechanical Polishing (CMP); that is, the portions of the liner oxide 214 and the fill layer 216 over the mask layer 206 are removed. The mask layer 206 can be the polish stop layer in the CMP process. The portions of the liner oxide 214 and the fill layer 216 in the trench 210 can be regarded as an isolation layer 218 herein.

Figure 2H:
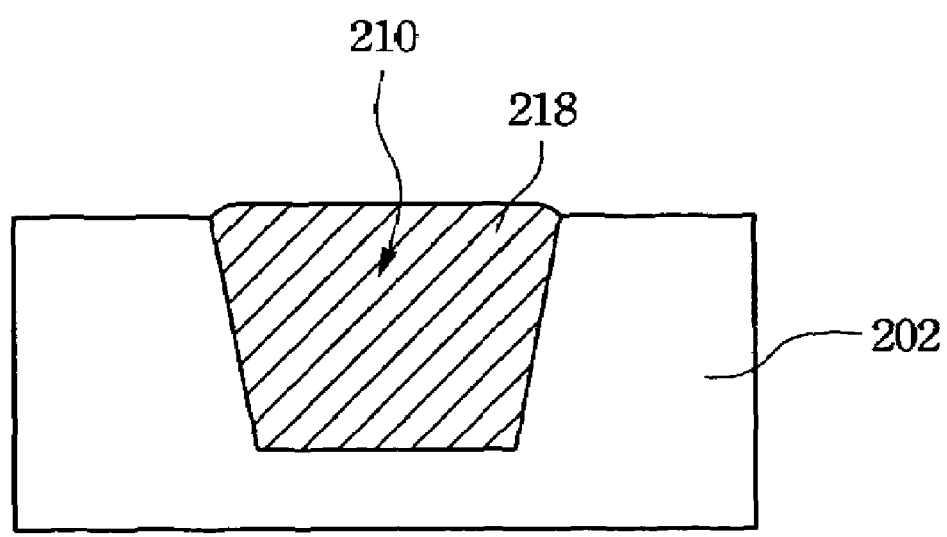

In FIG. 2H, an STI structure according to the embodiment of the present invention is completed by utilizing an etching process such as wet etching to remove the portions of the mask 206, the pad oxide 204 and the isolation layer 218 over the silicon substrate 202.

A STI structure according to the embodiment of the present invention is showed in FIG. 2H, the isolating property of which is better. Because the liner oxide 214 adhered inside of the trench 210 is formed by oxidizing the amorphous silicon material, the thickness of the whole liner oxide 214 is very uniform, and the stress does not appear at the corners of the liner oxide 214. Thus, the leakage risk can be further prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a shallow trench isolation (STI) structure with reduced stress on a substrate, comprising:
   forming a pad oxide on said substrate;
   depositing a mask layer on said pad oxide;
   coating a photoresist on said mask layer;
   removing a portion of said mask layer and said pad oxide exposed by said photoresist;
   removing a portion of said substrate exposed by said mask layer and said pad oxide for forming a trench;
   depositing an amorphous silicon layer on the surface of said trench and said mask layer;
   oxidizing said amorphous silicon layer for forming a liner oxide;
   depositing a fill layer into said trench and on a surface of said liner oxide;
   removing a portion of said liner oxide and said fill layer over said mask layer; and
   removing said mask layer, said pad oxide and a portion of said fill layer over said substrate.

2. The method of claim 1, wherein a material of said substrate is a single crystal of silicon.

3. The method of claim 1, wherein said pad oxide is formed by thermal oxidation.

4. The method of claim 1, wherein a material of said mask layer is silicon nitride ($Si_3N_4$).

5. The method of claim 1, wherein said trench is formed by utilizing a Reactive Ion Etching (RIE) process to etch said substrate.

6. The method of claim 1, wherein said amorphous silicon layer is deposited by a Low Pressure Chemical Vapor Deposition (LPCVD) process.

7. The method of claim 1, wherein a thickness of said amorphous silicon layer is between about 1 nm and 30 nm.

8. The method of claim 1, wherein said amorphous silicon layer is oxidized by a furnace oxidation process or a Rapid Thermal Process (RTP).

9. The method of claim 1, wherein a material of said fill layer is a silicon dioxide ($SiO_2$).

10. The method of claim 9, wherein said silicon dioxide is produced by a Chemical Vapor Deposition (CVD) process, wherein the deposition vapor source is Tetraethylorthosilicate (TEOS).

11. The method of claim 1, wherein the portion of said liner oxide and said fill layer over said mask layer is removed by a Chemical Mechanical Polishing (CMP) process.

12. The method of claim 1, wherein said mask layer, said pad oxide and the portion of said fill layer over said substrate are removed by wet etching.

* * * * *